United States Patent
Chu

(10) Patent No.: US 9,918,397 B2
(45) Date of Patent: Mar. 13, 2018

(54) OPEN CHASSIS AND SERVER MODULE INCORPORATING THE SAME

(71) Applicant: Facebook, Inc., Menlo Park, CA (US)

(72) Inventor: Renee Chu, San Francisco, CA (US)

(73) Assignee: Facebook, Inc., Menlo Park, CA (US)

( * ) Notice: Subject to any disclaimer, the term of this patent is extended or adjusted under 35 U.S.C. 154(b) by 74 days.

(21) Appl. No.: 14/750,686

(22) Filed: Jun. 25, 2015

(65) Prior Publication Data

US 2016/0381824 A1    Dec. 29, 2016

(51) Int. Cl.
*H05K 7/14* (2006.01)

(52) U.S. Cl.
CPC .................. *H05K 7/1487* (2013.01)

(58) Field of Classification Search
CPC .... H05K 7/1488; H05K 7/183; H05K 7/1489; H05K 7/186; H05K 7/20736; H05K 7/1485; H05K 7/1487; H02B 1/013; H02B 1/01; H02B 1/014; G06F 1/087
USPC ......................................... 361/679.32, 679.33
See application file for complete search history.

(56) References Cited

U.S. PATENT DOCUMENTS

| | | | |
|---|---|---|---|
| 3,482,895 A * | 12/1969 | Becklin ................ | A47B 96/06 206/305 |
| 4,988,008 A * | 1/1991 | Blum .................... | H02B 1/01 211/182 |
| 5,372,262 A * | 12/1994 | Benson ................. | H05K 7/183 211/189 |
| 5,540,339 A * | 7/1996 | Lerman ................ | E05D 15/502 16/381 |
| 5,749,476 A * | 5/1998 | Besserer ............... | H02B 1/301 211/182 |
| 6,019,446 A * | 2/2000 | Laboch ................. | H02B 1/01 211/26 |
| 6,591,997 B2 * | 7/2003 | Hung ..................... | H05K 7/183 211/183 |
| 6,655,533 B2 * | 12/2003 | Guebre-Tsadik ...... | H05K 7/186 211/175 |
| 6,688,712 B2 * | 2/2004 | Adams .................. | E04B 1/3483 211/191 |
| 7,855,885 B2 * | 12/2010 | Adducci ................ | H05K 7/186 211/26 |
| 8,152,249 B2 * | 4/2012 | Becklin ................ | H05K 7/1421 312/223.1 |
| 8,281,940 B2 * | 10/2012 | Fan ....................... | H05K 7/1488 211/26 |
| 8,400,765 B2 * | 3/2013 | Ross ..................... | H05K 7/20727 165/104.33 |

(Continued)

*Primary Examiner* — Patrick D Hawn
(74) *Attorney, Agent, or Firm* — Perkins Coie LLP

(57) ABSTRACT

Technology is provided for an open chassis for use with server modules. The open chassis includes an end frame having opposed upper corner portions and opposed lower corner portions. A pair of lower beams, each having a proximal end portion, are connected to a respective lower corner portion of the end frame. A pair of upper beams, each having a proximal end portion, are connected to a respective upper corner portion of the end frame. First and second columns extend between distal end portions of the lower beams and the upper beams. A cross-member extends between the distal end portions of the lower beams. Each beam includes an outward facing surface and an inward facing surface, and at least one of the beams includes a relief formed in its corresponding inward facing surface.

5 Claims, 5 Drawing Sheets

(56) References Cited

U.S. PATENT DOCUMENTS

| | | | | |
|---|---|---|---|---|
| 8,901,418 B2* | 12/2014 | Walker | ............... | H05K 5/0247 |
| | | | | 174/50 |
| 8,913,393 B2* | 12/2014 | Mimlitch, III | ....... | H05K 7/1488 |
| | | | | 211/26 |
| 8,925,739 B2* | 1/2015 | Crippen | ............... | H05K 7/1488 |
| | | | | 211/26 |
| 9,448,599 B2* | 9/2016 | Ehlen | ................ | G06F 1/187 |
| 2002/0046979 A1* | 4/2002 | Larsen | ................ | H05K 7/1488 |
| | | | | 211/26 |
| 2003/0030988 A1* | 2/2003 | Garnett | .................. | G06F 1/183 |
| | | | | 361/724 |
| 2003/0062326 A1* | 4/2003 | Guebre-Tsadik | ...... | H05K 7/186 |
| | | | | 211/26 |
| 2003/0071002 A1* | 4/2003 | Hung | .................. | H05K 7/183 |
| | | | | 211/183 |
| 2004/0016713 A1* | 1/2004 | Wyatt | ................ | A47B 96/1408 |
| | | | | 211/183 |
| 2004/0246671 A1* | 12/2004 | Cheng | .................... | G06F 1/181 |
| | | | | 361/679.37 |
| 2006/0043031 A1* | 3/2006 | Rinderer | ............... | H05K 7/186 |
| | | | | 211/26 |
| 2007/0175836 A1* | 8/2007 | Bumeder | ............... | H04Q 1/064 |
| | | | | 211/26 |
| 2008/0035588 A1* | 2/2008 | Liang | .................. | H05K 7/1421 |
| | | | | 211/26 |
| 2009/0071916 A1* | 3/2009 | Becklin | ................ | H05K 7/1421 |
| | | | | 211/26 |
| 2009/0236957 A1* | 9/2009 | Hudz | ..................... | G11B 33/02 |
| | | | | 312/265.4 |
| 2010/0187148 A1* | 7/2010 | Becklin | ................ | H05K 7/1421 |
| | | | | 206/521 |
| 2011/0012489 A1* | 1/2011 | Shen | ..................... | A47B 96/14 |
| | | | | 312/326 |
| 2011/0114575 A1* | 5/2011 | Peng | ......................... | H02B 1/01 |
| | | | | 211/26 |
| 2011/0273835 A1* | 11/2011 | Katakura | ................ | G06F 1/181 |
| | | | | 361/679.33 |
| 2012/0012543 A1* | 1/2012 | Fan | ..................... | H05K 7/1488 |
| | | | | 211/26 |
| 2012/0018389 A1* | 1/2012 | Fan | ..................... | H05K 7/1489 |
| | | | | 211/26 |
| 2012/0069514 A1* | 3/2012 | Ross | .................. | H05K 7/20727 |
| | | | | 361/679.33 |
| 2012/0273436 A1* | 11/2012 | Qin | ..................... | H05K 7/1497 |
| | | | | 211/26 |
| 2012/0273438 A1* | 11/2012 | Nordin | ................... | H04Q 1/025 |
| | | | | 211/26 |
| 2013/0091689 A1* | 4/2013 | Mimlitch, III | ....... | H05K 7/1488 |
| | | | | 29/525.01 |
| 2013/0127310 A1* | 5/2013 | Yu | .......................... | G06F 1/187 |
| | | | | 312/223.2 |
| 2015/0293566 A1* | 10/2015 | Ehlen | ..................... | G06F 1/187 |
| | | | | 361/679.33 |
| 2015/0342082 A1* | 11/2015 | Roehrl | ................... | H05K 7/183 |
| | | | | 211/26 |
| 2016/0261083 A1* | 9/2016 | Chu | ..................... | H01R 43/205 |
| 2016/0262282 A1* | 9/2016 | Li | ........................ | H01R 43/205 |

\* cited by examiner

US 9,918,397 B2

OPEN CHASSIS AND SERVER MODULE INCORPORATING THE SAME

TECHNICAL FIELD

This patent application is directed to data storage server configurations and, more specifically, to an open chassis and server module incorporating the same.

BACKGROUND

Data centers are complex facilities including rows of data storage server racks. Each server rack has a three dimensional footprint which defines valuable real estate. Thus, each server rack's footprint should be used efficiently in order to reduce costs and maximize profit. The more storage devices housed within a server rack, the more efficient the use of the footprint. However, server racks must be designed to be serviceable, which becomes more difficult as the density of the storage devices increases. While existing server rack designs are functional, there is still a need for higher density storage server rack designs that are also easily serviced.

BRIEF DESCRIPTION OF THE DRAWINGS

Embodiments of the open chassis introduced herein may be better understood by referring to the following Detailed Description in conjunction with the accompanying drawings, in which like reference numerals indicate identical or functionally similar elements.

Figure 1:
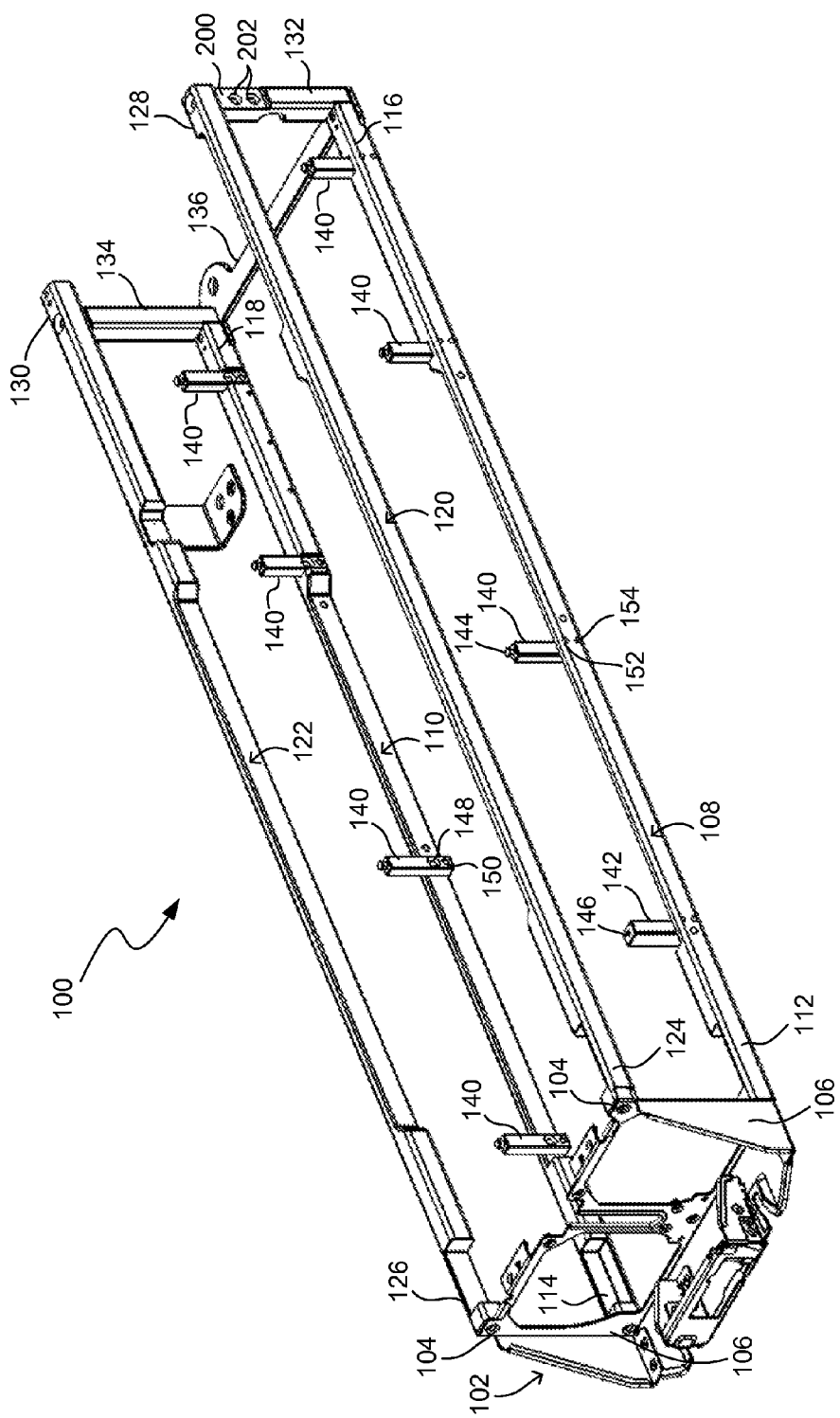
FIG. 1 is an isometric view of an open chassis according to a representative embodiment, as viewed from the rear.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

An open chassis and a server module incorporating the same are disclosed. In an embodiment, the open chassis includes an end frame having opposed upper corner portions and opposed lower corner portions. A pair of lower beams, each having a proximal end portion, are connected to a respective lower corner portion of the end frame. A pair of upper beams, each having a proximal end portion, are connected to a respective upper corner portion of the end frame. First and second columns extend between distal end portions of the lower beams and the upper beams. A cross-member extends between the distal end portions of the lower beams. Each beam includes an outward facing surface and an inward facing surface, and at least one of the beams includes a relief formed in its corresponding inward facing surface.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates an open chassis 100 according to a representative embodiment. The open chassis 100 is discussed below with a special frame of reference using the orientation illustrated in FIG. 1 for purposes of clarity and understanding, although it is to be understood that the open chassis 100 can be positioned in a different special orientation, such as when in use. The open chassis 100 includes an end frame 102 having opposed upper corner portions 104 and opposed lower corner portions 106. The open chassis 100 includes first and second lower beams 108 and 110, respectively, and first and second upper beams 120 and 122, respectively. The first lower beam 108 includes a proximal end portion 112 and a distal end portion 116. Similarly, the second lower beam 110 includes a proximal end portion 114 and a distal end portion 118. The first upper beam 120 includes a proximal end portion 124 and a distal end portion 128. The second upper beam 122 includes a proximal end portion 126 and a distal end portion 130. The proximal end portions 112 and 114 of the first and second lower beams 108 and 110, respectively, are each connected to a corresponding lower corner portion 106 of end frame 102. Similarly, the proximal end portions 124 and 126 of the first and second upper beams 120 and 122, respectively, are each connected to a corresponding upper corner portion 104 of end frame 102.

The open chassis 100 also includes a first column 132 extending between the distal end portions 116 and 128 of the first lower beam 108 and the first upper beam 120, respectively. A second column 134 extends between the distal end portions 118 and 130 of the second lower beam 110 and the second upper beam 122, respectively. As can be appreciated in the figure, the beams 108, 120, 110, and 122 in the illustrated orientation are arranged horizontally, while the end frame 102 and the columns 132 and 134 are oriented vertically. A cross-member 136 extends horizontally between the distal end portions 116 and 118 of the first and second lower beams 108 and 110, respectively. The first column 132 includes a notch or relief 200 having a pair of fastener apertures 202 for mounting a peripheral component interconnect (PCI) module bracket, as explained below with respect to FIG. 5.

With continued reference to FIG. 1, a plurality of circuit board mounts, such as stanchions 140 and 142, extend upwardly from the first and second lower beams 108 and 110, respectively. In some embodiments, the stanchions 140 include a keyhole mounting pin 144. In other embodiments, the circuit board mounts such as the stanchion 142 include a threaded aperture 146. The stanchions 140 and 142 can be mounted with suitable fasteners such as a screw 148 and/or an alignment pin 150, which can extend into a mating threaded aperture 152 and a mating close fit bore 154 that are formed in the beams. Although the figures depict upwardly extending circuit board mounts, suitable circuit board mounts (e.g., hangers) can extend downward from the first and second upper beams 120 and 122, respectively, for example.

Figure 2:
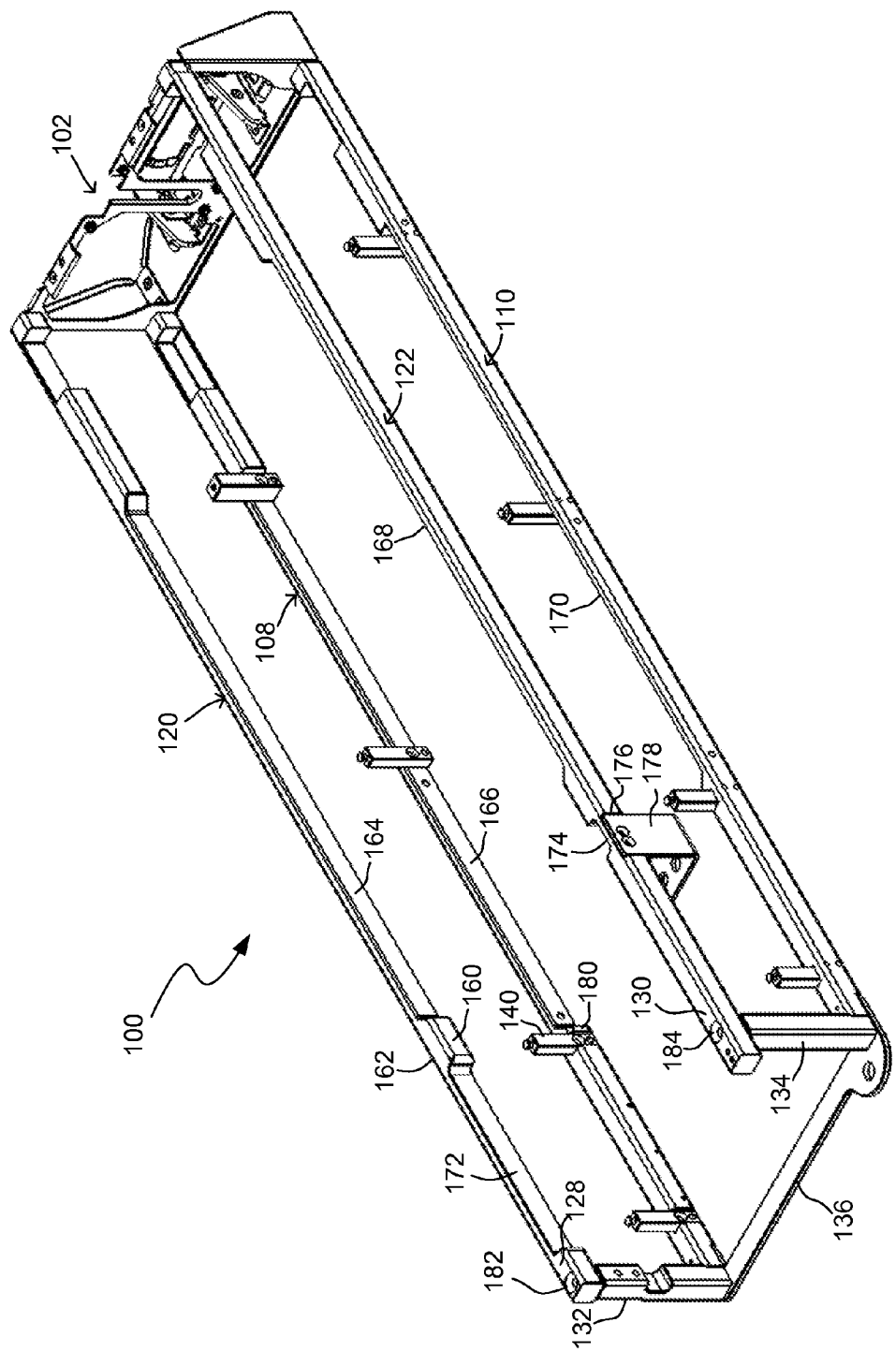
FIG. 2 is an isometric view of the open chassis shown in FIG. 1, as viewed from the front.

As shown in FIG. 2, the beams 108, 110, 120, and 122 each include an inward facing surface and an opposite outward facing surface. For example, the first upper beam 120 includes an inward facing surface 160 and an outward facing surface 162. Each beam includes one or more reliefs formed in the inward facing surface. For example, the first upper beam 120 includes reliefs 164 and 172. Similarly, the first lower beam 108 includes a relief 166, the second upper beam 122 includes reliefs 168 and 174, and the second lower beam 110 includes a relief 170. As will be explained more fully below, these reliefs provide clearance for facilitating the servicing of components, such as electronic components on a printed circuit board positioned in the open chassis 100. The first and second lower beams 108 and 110, respectively, also include notches 180 formed in the inward facing surfaces to receive stanchions 140. The second upper beam 122 also includes a notch or relief 176 that is sized to receive a PCI module bracket 178. Also shown in FIG. 2, the distal end portions 128 and 130 of the first and second upper beams 120 and 122, respectively, are attached to their corresponding first and second columns 132 and 134, respectively, by suitable fasteners extending through apertures 182 and 184.

Figure 3:
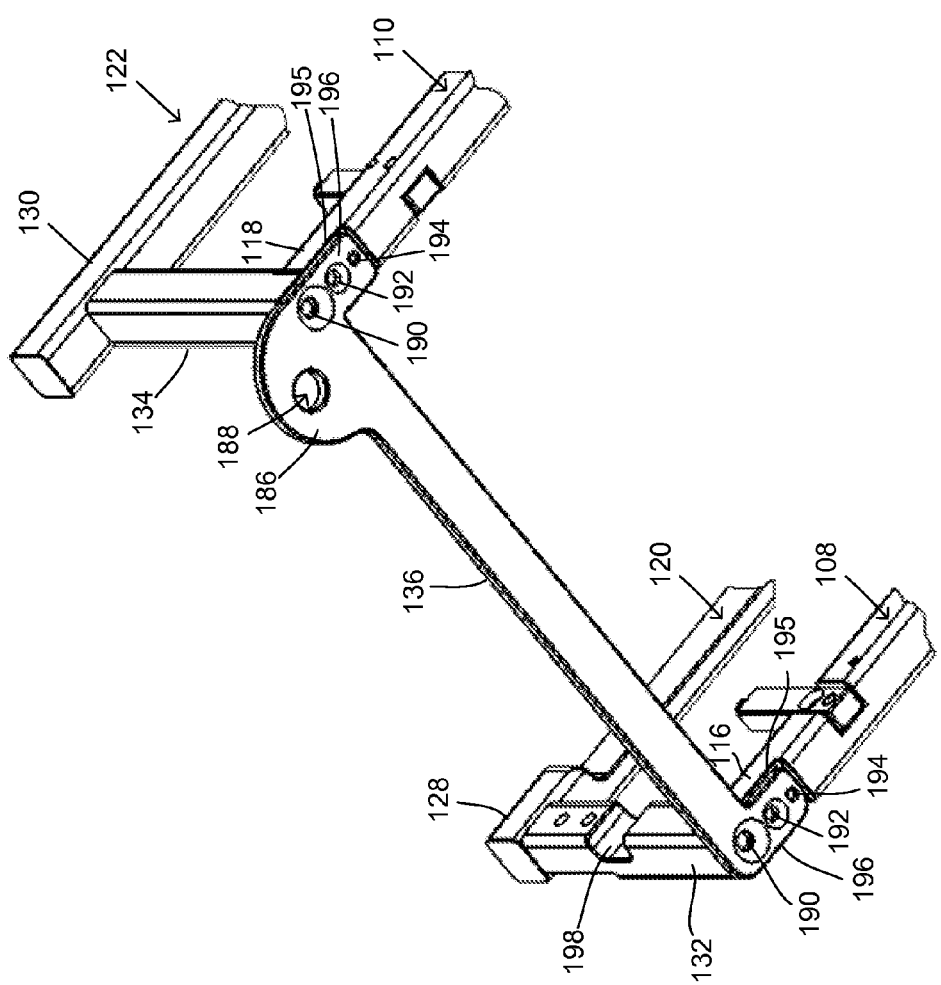
FIG. 3 is a partial isometric view of the front end of the open chassis shown in FIGS. 1 and 2, as viewed from underneath.

As shown in FIG. 3, the cross-member 136 includes a pair of tabs 196, each of which connects a respective lower beam to a corresponding column. For example, the distal end portion 116 of the first lower beam 108 is connected to the first column 132 with corresponding fasteners 190, 192 and an alignment pin 194. Similarly, the distal end portion 118 of the second lower beam 110 is connected to the second column 134 with fasteners 190, 192 and alignment pin 194. The distal end portions 116 and 118 of the first and second lower beams 108 and 110, respectively, include notches 195 sized to receive a corresponding tab 196. The cross-member 136 also includes a retainer tab 186 that includes a retainer aperture 188. A suitable retainer fastener (not shown) can be mounted to the retainer aperture 188 for securing the open chassis 100 in a corresponding server rack assembly. In some embodiments, the first column 132 includes a clearance notch 198 for facilitating the installation of a PCI module.

Figure 4:
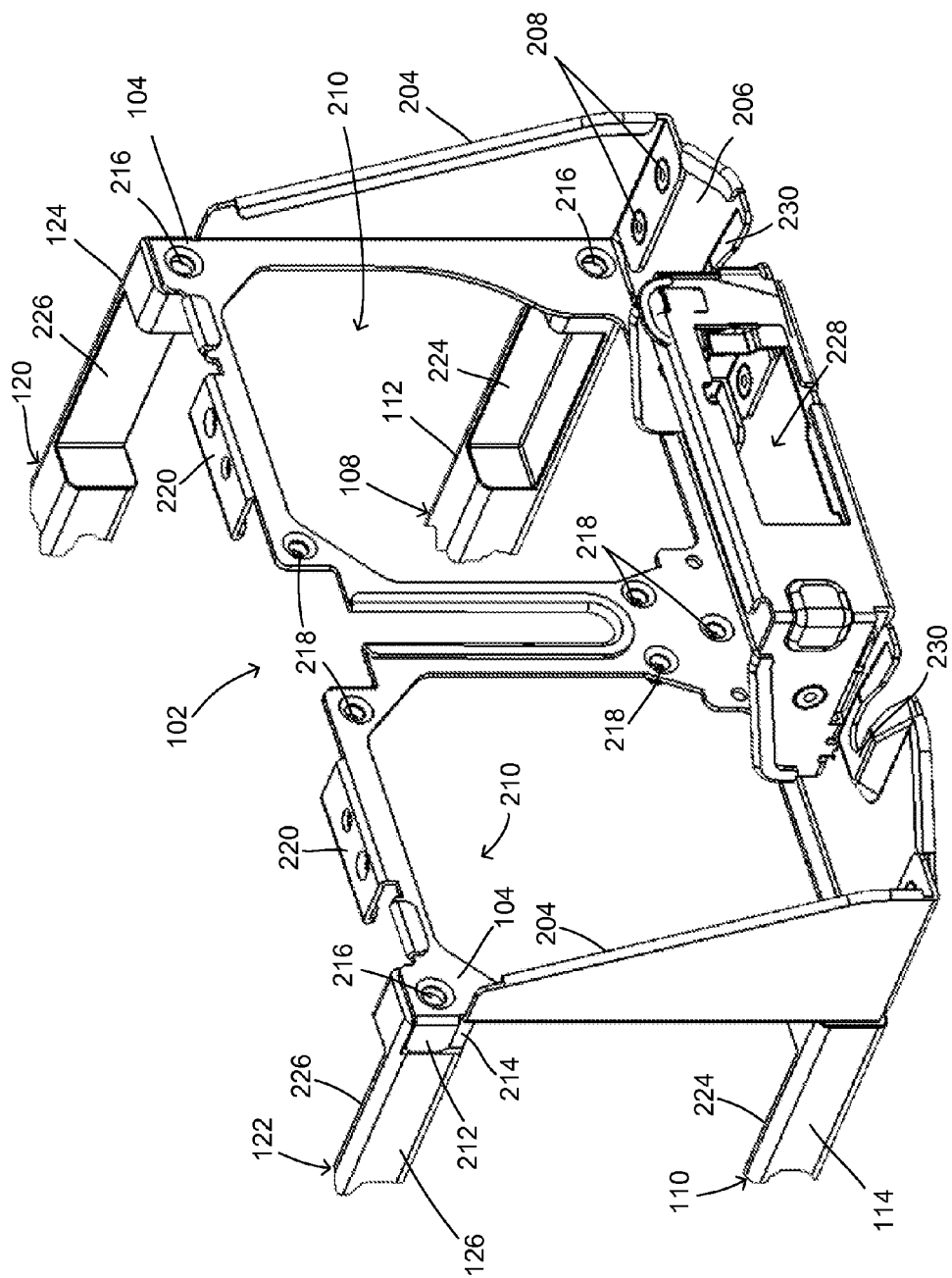
FIG. 4 is a partial isometric view of the open chassis shown in FIGS. 1-3, as viewed from the rear.

With reference to FIG. 4, the end frame 102 is comprised of a sheet metal construction having a pair of gussets or gusset flanges 204, which support a connector bracket 206. The connector bracket 206 is attached to the gusset flanges 204 with suitable fasteners 208, as shown. The connector bracket 206 includes a connector aperture 228 configured to receive a suitable server module connector (not shown). The connector bracket 206 also includes a pair of mounting slots 230 for interfacing with a server rack. The end frame 102 also includes a pair of fan or air flow openings 210 to allow air flow through the open chassis. The proximal end portions of the upper and lower beams are attached to the end frame 102 with suitable fasteners extending through apertures 216. The end frame 102 also includes apertures 218 suitable for mounting a pair of fans adjacent the air flow openings 210. The proximal end portions 112 and 114 of the first and second lower beams 108 and 110, respectively, include fan pockets 224 sized and configured to receive a corner of a fan. The proximal end portions 124 and 126 of the first and second upper beams 120 and 122, respectively, include fan notches 226. Each upper corner portion 104 can include an alignment tab 212 that cooperates with an alignment notch 214 formed in the proximal end portions 124 and 126 of the first and second upper beams 120 and 122, respectively. The end frame 102 also includes fan mounting tabs 220.

Figure 5:
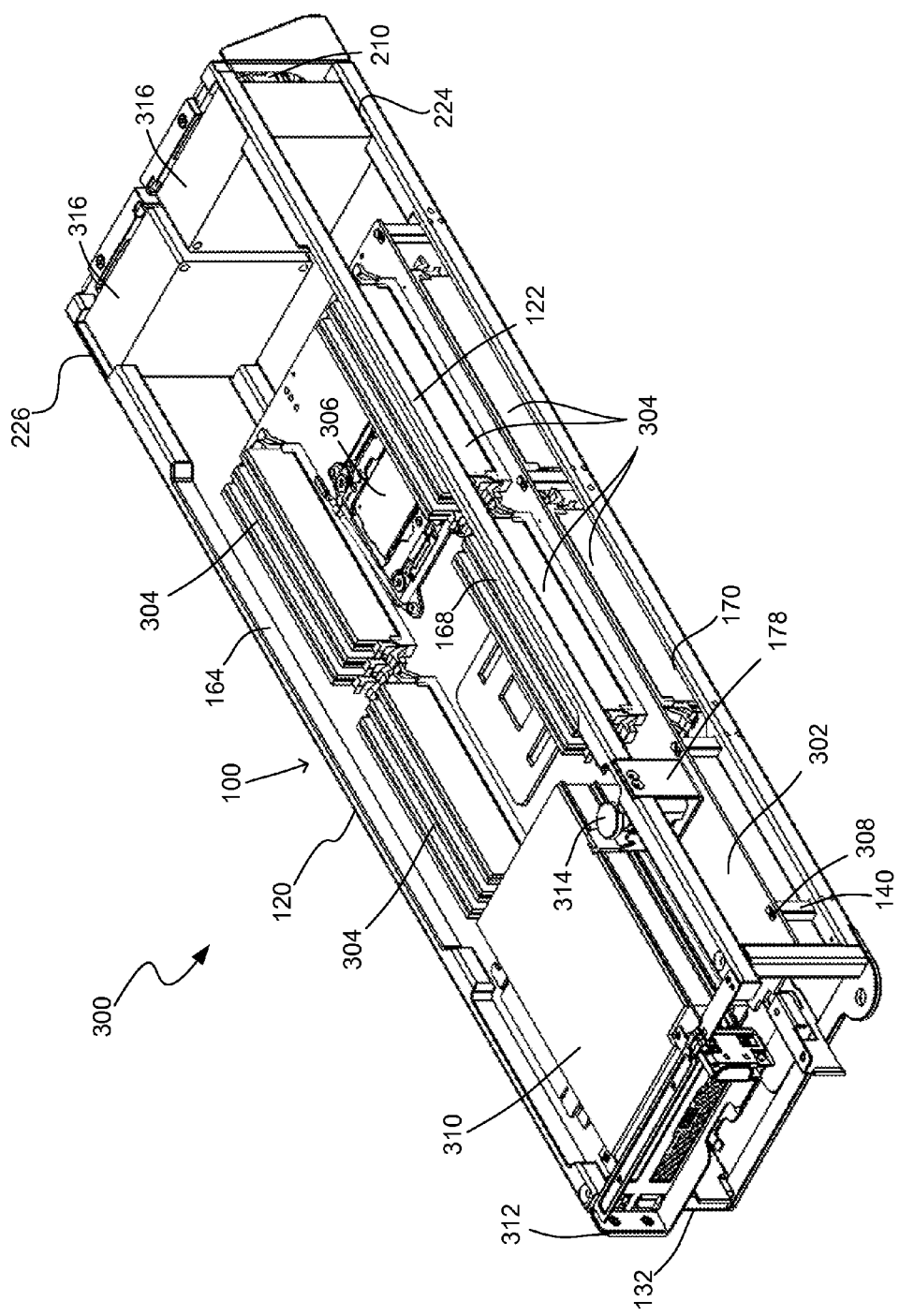
FIG. 5 is an isometric view illustrating a representative server module including the open chassis of FIGS. 1-4.

FIG. 5 illustrates a computer module, such as a server module 300, including the open chassis 100 as described above. The server module 300 includes a printed circuit board (PCB) 302 that supports a central processing unit (CPU) 306 and a plurality of memory cards 304. As mentioned above, the reliefs 164, 168, 170, and 166 (relief 166 not shown) provide access to the outermost memory cards 304, thereby enhancing the serviceability of the server module 300. The server module 300 also includes a PCI module 310 mounted to the first and second upper beams 120 and 122, respectively, with a PCI bracket 312 that extends between the second upper beam 122 and the first column 132. The PCI module 310 is also supported on PCI module bracket 178 with a PCI latch 314. In some embodiments, the PCB 302 includes a plurality of keyhole slots 308 that are positioned to mate with the stanchions 140. Cooling fans 316 are retained in fan pockets 224 and fan notches 226 adjacent the fan openings 210.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A modular chassis configurable for use with a server module, comprising:
    an end frame having opposed lower corner portions;
    first and second beams spaced apart from each other and each having a proximal end portion connected to a respective lower corner portion of the end frame, the first and second beams being configured to receive and retain server components;
    first and second upper beams, each having a proximal end portion connected to a respective upper corner portion of the end frame;
    a cross-member extending between distal end portions of the first and second beams; and
    a plurality of spaced apart stanchions each attached to one of the first and second beams, wherein each of the plurality of spaced apart stanchions terminates between the first and second beams and the first and second upper beams, and wherein selected ones of the plurality of stanchions include a keyhole mounting pin configured to mate with a corresponding keyhole slot of a printed circuit board;
    wherein the first and second beams, the cross-member, and the stanchions being interconnected to define an open interior area configured to provide substantially open access to the server components.

2. The chassis of claim 1, further comprising:
    a first column extending between the distal end portion of the first beam and a distal end portion of the first upper beam; and
    a second column extending between the distal end portion of the second beam and a distal end portion of the second upper beam.

3. The chassis of claim 2, wherein the cross-member connects the first beam to the first column and connects the second beam to the second column.

4. The chassis of claim 2, wherein the first upper beam is fastened to the first column, and the second upper beam is fastened to the second column.

5. The chassis of claim 1, wherein the first and second beams each include an outward facing surface and an inward facing surface, and wherein at least one of the first and second beams includes a relief formed in the inward facing surface.

* * * * *